(12) United States Patent
Chabert

(10) Patent No.: US 10,298,178 B2
(45) Date of Patent: May 21, 2019

(54) COMMUNICATION APPARATUS WITH ISOLATION OF THE RECEIVE CHAIN

(71) Applicant: STMicroelectronics SA, Montrouge (FR)

(72) Inventor: Laurent Chabert, Saint Martin d'Heres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/945,384

(22) Filed: Apr. 4, 2018

(65) Prior Publication Data

US 2018/0323749 A1    Nov. 8, 2018

(30) Foreign Application Priority Data

May 5, 2017    (FR) ...................................... 17 53995

(51) Int. Cl.

| | | |
|---|---|---|
| H03F 1/22 | (2006.01) |
| H03F 1/26 | (2006.01) |
| H03F 1/52 | (2006.01) |
| H03F 1/56 | (2006.01) |
| H03F 3/20 | (2006.01) |
| H03F 3/72 | (2006.01) |
| H04B 1/16 | (2006.01) |
| H04B 1/44 | (2006.01) |
| H03F 3/195 | (2006.01) |

(52) U.S. Cl.
CPC ............... *H03F 1/223* (2013.01); *H03F 1/26* (2013.01); *H03F 1/523* (2013.01); *H03F 1/565* (2013.01); *H03F 3/195* (2013.01); *H03F 3/72* (2013.01); *H04B 1/16* (2013.01); *H04B 1/44* (2013.01); *H03F 3/20* (2013.01); *H03F 2200/222* (2013.01); *H03F 2200/294* (2013.01); *H03F 2200/372* (2013.01)

(58) Field of Classification Search
CPC ..... H04B 1/44; H04B 1/525; H03F 2200/216; H03F 2200/231; H03F 2200/252
See application file for complete search history.

(56) References Cited

U.S. PATENT DOCUMENTS

| | | | | |
|---|---|---|---|---|
| 5,784,687 | A * | 7/1998 | Itoh .......................... | H04B 1/48 333/103 |
| 6,341,216 | B1 * | 1/2002 | Itoh .......................... | H04B 1/48 455/129 |
| 7,899,409 | B2 * | 3/2011 | Huang .................. | H04B 1/0458 330/277 |
| 8,768,270 | B2 * | 7/2014 | Perumana .............. | H04B 1/525 455/39 |

(Continued)

FOREIGN PATENT DOCUMENTS

WO    2012054343 A1    4/2012

*Primary Examiner* — Duc M Nguyen
(74) *Attorney, Agent, or Firm* — Slater Matsil, LLP

(57) ABSTRACT

A communication apparatus includes an antenna and a receive chain. The receive chain includes a switching transistor, and amplification transistor and a discharge transistor. The amplification transistor has a control terminal coupled to a current path terminal of the switching transistor. The discharge transistor has a current path coupled between the control terminal of the amplification transistor and a ground terminal. The discharge circuit is configured to discharge an intrinsic capacitance of the switching circuit when the switching transistor is in an off state.

22 Claims, 4 Drawing Sheets

(56) References Cited

U.S. PATENT DOCUMENTS

| | | | |
|---|---|---|---|
| 8,886,136 B1 | 11/2014 | Signoff et al. | |
| 9,143,185 B2* | 9/2015 | Wang | H04B 1/48 |
| 9,397,720 B2* | 7/2016 | Jerng | H04B 1/00 |
| 9,479,160 B2* | 10/2016 | Srihari | H03K 17/693 |
| 2002/0177417 A1* | 11/2002 | Visser | H04B 1/48 |
| | | | 455/83 |
| 2007/0232241 A1* | 10/2007 | Carley | H04B 1/44 |
| | | | 455/83 |
| 2011/0140764 A1* | 6/2011 | Shin | H03K 17/005 |
| | | | 327/437 |
| 2011/0142263 A1 | 6/2011 | Sun | |
| 2011/0234333 A1* | 9/2011 | Tsukahara | H03K 17/002 |
| | | | 333/104 |
| 2011/0285475 A1* | 11/2011 | Lu | H04B 1/48 |
| | | | 333/104 |
| 2018/0323821 A1* | 11/2018 | Chabert | H03F 1/523 |

* cited by examiner

COMMUNICATION APPARATUS WITH ISOLATION OF THE RECEIVE CHAIN

CROSS-REFERENCE TO RELATED APPLICATIONS

This application claims priority to French Application No. 1753995, filed on May 5, 2017, which application is hereby incorporated herein by reference.

TECHNICAL FIELD

Embodiments of the invention relate to a communication apparatus with isolation of the receive chain.

BACKGROUND

A communication apparatus generally comprises a signal transmit chain and a signal receive chain connected to an antenna and to a baseband processing device.

FIG. 1 shows a communication apparatus 1 according to the prior art comprising a transmit chain Tx and a receive chain Rx connected to an antenna ANT and a baseband processing unit 2, notably a baseband processor.

The transmit chain Tx notably comprises a power amplifier device 3 ("PA"), an output of which is connected to the antenna ANT by the intermediary of a transistor T1. The common node between the amplifier device 3 and the transistor T1 is connected to ground GND by the intermediary of a transistor T2. The input of the amplifier device 3 is connected to other conventional and known elements of the transmit chain (not shown here in order to simplify the figure).

The receive chain Rx comprises an amplifier device 4 commonly denoted by those skilled in the art by the name "low noise amplifier" ("LNA") an input of which is connected to the antenna ANT by the intermediary of a transistor T3. The common node between the antenna ANT and the amplifier device 4 is connected to ground GND by the intermediary of a transistor T4. The output of the amplifier device 4 is connected to other conventional and known elements of the receive chain (not shown in order to simplify the figure).

The amplifier device conventionally comprises at least one amplification transistor T.

The transistors T1, T2, T3 and T4 can be of the same type, for example thick gate oxide transistors, and can be of different sizes. They are of any type whatsoever, for example NMOS field effect transistors. The switching circuit is controlled by a controller incorporated in the baseband processing unit 2.

In signal transmit mode, the transistors T1 and T4 are on. They behave like parasitic resistances Ron. The transistor T4 provides the grounding of the input of the amplifier device 4. The transistors T2 and T3 are off. They behave like parasitic capacitances Coff.

The transistor T4 forms, in transmit mode, an element for discharging the switching circuit of the receive chain.

In receive mode, the transistors T1 and T4 are off and the transistors T2 and T3 are on. The transistor T2 provides the grounding of the output of the amplifier device 3. The transistors T1 and T4 behave like parasitic capacitances Coff. The transistors T2 and T3 behave like parasitic resistances Ron. These parasitic elements degrade the noise figure of the amplifier device 4.

The quality of the device is described by the coefficient Coff*Ron. However, this coefficient is fixed for a given technology.

In transmit mode, the amplifier device 3 transmits for example a signal of power 33 dBm, that is to say 2 W, at a voltage of 10V. The parasitic capacitance of the transistor T3 allows a parasitic current to flow, which supplies the amplifier device 4.

The current resulting from the parasitic capacitance of the transistor T3 damages the amplification transistor T if the protection given by T4 is not sufficient. Consequently the switching transistors are sized such that they channel the parasitic power well below the voltage of 10V. They therefore have appropriate dimensions.

Generally, each switching transistor T1, T2, T3 and T4 comprises a set of transistors assembled in series and in parallel in the form of a matrix. This arrangement makes it possible to find functional and non-destructive configurations for a given Ron*Coff and limits the voltage liable to damage the amplifier device 4.

However, it is desirable to find a compromise between the overall dimensions of the matrix and the improvement of the protection of the amplification transistor T.

The different elements of the switching circuit are moreover separated from each other by a few micrometers. Consequently, electromagnetic and substrate coupling phenomena appear. These phenomena also degrade the low noise figure of the amplifier device.

SUMMARY

Embodiments of the invention relate to communication apparatuses, in particular embodiments for wireless communication, such as cellular mobile telephones or digital tablets, and notably low noise amplifier devices known in the prior art by the acronym "LNA" (standing for "Low Noise Amplifier) incorporated in the receive chains of these apparatuses.

Embodiments improve the low noise figure of the amplifier device and to reduce the overall dimensions of the switching circuit whilst protecting that amplifier from any damage.

According to one embodiment, it is advantageously proposed to incorporate a discharge circuit in the low noise amplifier device making it possible to discharge the intrinsic capacitance of the switch circuit of the receive chain and thus to reduce the coupling phenomena and the size of the switching transistors.

According to one aspect, a communication apparatus is proposed comprising an antenna, a receive chain comprising an amplifier device and a controllable switch circuit having an intrinsic capacitance, coupled between the input of the amplifier device and the antenna and having an off state and an on state, and a discharge circuit configured for discharging the intrinsic capacitance of the switching circuit in its off state.

According to this aspect, the amplifier device incorporates the discharge circuit.

In other words, the discharge circuit, comprising for example a discharge transistor, is physically distant from the other switching transistors. This reduces the substrate and electromagnetic coupling phenomena and makes it possible to use switching transistors of smaller size.

According to one embodiment, the amplifier device also comprises an inductive element and an amplifier. The amplifier is connected to an input of the amplifier device by the intermediary of the inductive element, in which the discharge circuit is connected between the inductive element and the amplifier.

The inductive element also advantageously filters the parasitic current flowing through the intrinsic capacitance of the switching circuit.

According to one embodiment, the discharge circuit comprises at least one controllable discharge transistor.

According to one embodiment, the controllable discharge circuit comprises a matrix of discharge transistors controllable by the same control signal.

According to one embodiment, the amplifier comprises an amplification transistor.

According to one embodiment, the amplifier device also comprises a power supply terminal intended to be connected to ground. The control electrode of the amplification transistor is connected to an input of the amplifier device and the discharge circuit is connected between the control electrode of the amplification transistor and the power supply terminal.

According to another possible embodiment, the amplifier device also comprises a power supply terminal intended to be connected to ground. The discharge circuit is connected between the source of the amplification transistor and the power supply terminal.

According to another embodiment, the discharge circuit comprises a matrix of transistors.

According to one embodiment, the switching device comprises a transmit chain comprising a power amplifier coupled to the antenna by the intermediary of second controllable switching circuit having an off state and an on state.

According to another aspect, there is proposed an amplifier device incorporated in a communication apparatus such as defined above.

BRIEF DESCRIPTION OF THE DRAWINGS

Other advantages and features of the invention will become apparent on examination of the detailed description of embodiments, which are in no way limiting, and of the appended drawings in which.

DETAILED DESCRIPTION OF ILLUSTRATIVE EMBODIMENTS

Figure 1:
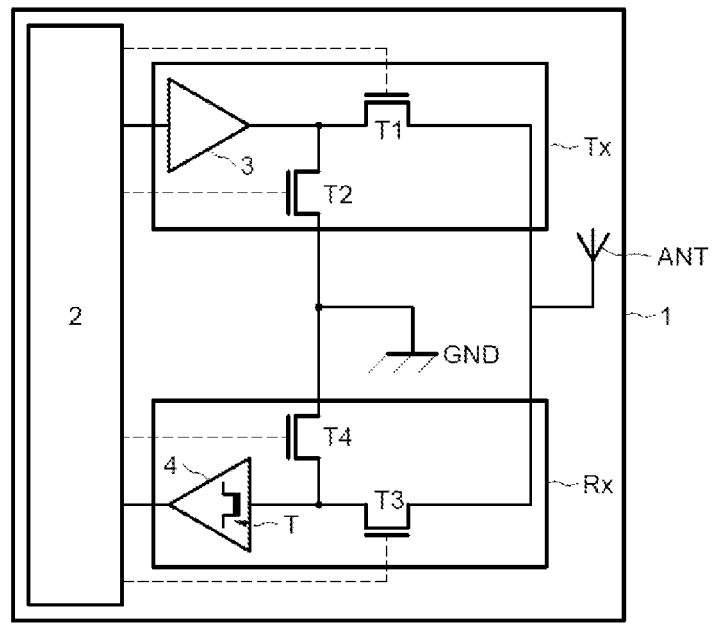
FIG. 1, already described, shows a prior art.
Figure 2:
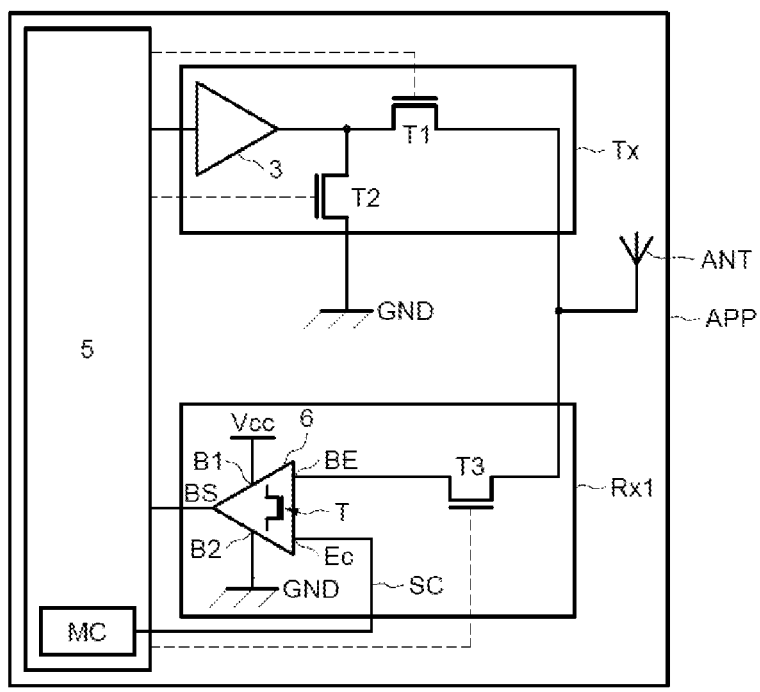
FIGS. 2 to 7 show embodiments of the invention.

Reference is now made to FIG. 2, which shows an example of embodiment of a communication apparatus APP.

The communication apparatus APP comprises the transmit chain Tx and a receive chain Rx1 connected to the antenna ANT and a baseband processing unit 5, notably a baseband processor.

The transmit chain Tx comprises the power amplifier device 3 ("PA"), an output of which is connected to the antenna ANT by the intermediary of the transistor T1. The common node between the amplifier device 3 and the transistor T1 is connected to ground GND by the intermediary of a transistor T2. The input of the amplifier device 3 is connected to other conventional and known elements of the transmit chain (not shown here in order to simplify the figure).

The receive chain Rx1 comprises a low noise amplifier device 6 comprising at least one amplification transistor T and the switching transistor T3. It no longer comprises the discharge circuit T4 located outside of the amplifier device 6. As will be seen in more detail below, this discharge circuit is incorporated in the amplifier device 6.

The amplifier device 6 comprises an input BE connected to the antenna ANT by the intermediary of the transistor T3, a control input Ec and an output BS connected to other conventional and known elements of the receive chain (not shown in order to simplify the figure). It comprises a first power supply terminal B1 intended to be connected to a first power supply voltage, notably a dc voltage Vcc, and a second power supply terminal B2 intended to be connected to a second power supply voltage, notably a ground GND.

The control input Ec of the amplifier device 6 is coupled to a controller MC incorporated in the baseband processing unit 5. The controller MC generates a control signal SC.

Figure 3:
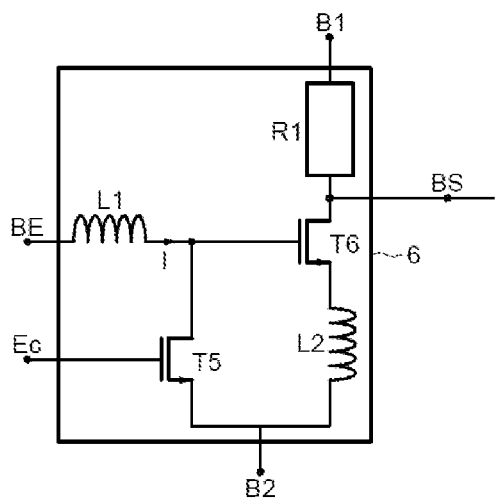

Reference is now made to FIG. 3, which shows an example of an embodiment of an amplifier device 6.

In this embodiment, the amplifier device 6 is arranged according to a common source configuration.

The amplifier device 6 comprises the discharge circuit comprising a discharge transistor T5, an amplifier comprising an amplification transistor T6, a resistive element R1, an impedance-matching inductive element L1 and a degeneration inductive element L2.

The impedance-matching inductive element L1 and the degeneration inductive element L2 make it possible to match the impedance of the input BE of the amplifier device 6 in order to optimize the transfer of power between elements connected to the input BE and the transistor T6.

The degeneration inductive element L2 improves the dynamic performance of the amplification transistor T6.

According to one embodiment, the transistors T5 and T6 are NMOS transistors.

The gate of the amplification transistor T6 is connected to the input BE of the amplifier device 6 by the intermediary of the inductive element L1. The source of the amplification transistor T6 is connected to a first terminal of the inductive element L2. The second terminal of the inductive element L2 is connected to the power supply terminal B2 (ground).

The drain of the amplification transistor T6 is connected to the output BS of the amplifier device 6. The resistive element R1 is connected at one end to the power supply terminal B1 and at the other end to the output BS.

The drain of the discharge transistor T5 is connected to the common node between the inductive element L1 and the gate of the amplification transistor T6. The source of the discharge transistor T5 is connected to the power supply terminal B2, and the gate is connected to the input Ec of the amplifier device 6.

In transmit mode, that is to say when the transistor T1 is on and the transistor T2 is off, the antenna ANT receives a signal emitted by the amplifier device 3. The emitted signal has for example a power of approximately 33 dBm, that is to say 10 mW, at a voltage of 10V.

The transistor T5 is controlled by the control signal SC received at the input Ec of the amplifier device 6 in such a way that it is on.

The transistor T3 is controlled by the baseband processing unit 5 in such a way that it is off, it behaves like a parasitic capacitance. It is connected to the antenna ANT and receives the signal emitted by the amplifier device 3.

The transistor T3 allows a parasitic current I to flow. The current I is attenuated by the inductive impedance-matching element L1. Consequently, the discharge transistor T5 is sized for a lower parasitic current I. The transistor T5 is of smaller size than in the case of a configuration of a receive branch known in the prior art.

In receive mode, that is to say when the transistors T1 and T5 are off and the transistors T2 and T3 are on, the antenna ANT receives for example a signal having a power of approximately −80 dBm, that is to say 0.01 nW.

The value of the bias voltage Vcc of the transistor T6 at the power supply terminal B1 and the value of the resistive element R1 are chosen such that the transistor T6 amplifies the signal received from the input BE according to a predefined operating point of the transistor T6.

The signal received by the antenna ANT is transmitted to the input BE of the amplifier device 6, and to the amplification transistor T6 which amplifies the signal received on its gate.

As the discharge transistor T5 is smaller, its parasitic capacitance has been reduced. The noise figure of the amplifier device 6 has been improved.

Moreover, the discharge transistor T5 is moved into the amplifier device 6. The distance between the transistors T1, T2, T3 and the discharge transistor T5 is greater. The substrate and electromagnetic coupling phenomena between the discharge transistor T5 and the other switching transistors are reduced.

This also contributes to the improvement of the noise figure of the amplifier device 6.

Figure 4:
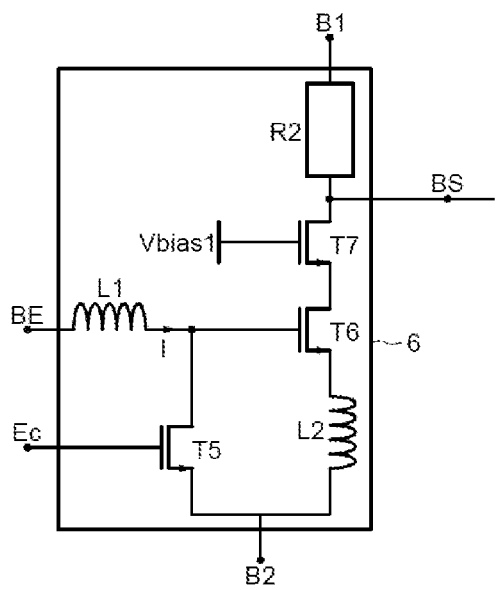

Reference is now made to FIG. 4 which shows an example of another embodiment of an amplifier device 6.

In this embodiment, the amplifier device 6 is produced according to a cascode common source configuration.

The elements identical to those described in the preceding embodiment are identified by the same numerical references. In this figure, the inductive elements L1 and L2, the discharge transistor T5 and the amplification transistor T6 are again present. These elements are arranged as described above.

The amplifier device 6 comprises moreover a transistor T7 supplied at its gate by a DC voltage Vbias1 and a resistive element R2.

The transistor T7 is in this case an NMOS transistor.

The drain of the amplification transistor T6 is connected to the source of the transistor T7. The drain of the transistor T7 is connected on the one hand to the output BS of the amplifier device 6 and, on the other hand, to a first terminal of the resistive element R2. The second terminal of the resistive element R2 is connected to the power supply terminal B1.

The value of the voltage Vbias1 is chosen to be higher than the threshold voltage of the transistor T7. The transistor T7 is on.

The value of the bias voltage Vcc of the transistor T6 at the power supply terminal B1 and the value of the resistive element R2 are chosen such that the transistor T6 amplifies the signal received from the input BE according to a predefined operating point of the transistor T6.

Advantageously, the electrical isolation of the amplification transistor T6 is improved and the discharge transistor T5 is of reduced sized in comparison with the switching transistors T1, T2, T3 and T4.

The transmit/receive functioning of this amplifier device 6 is identical to that described in the first embodiment.

Advantageously, a cascode amplifier has improved gain, noise, consumption and isolation properties in comparison with other non-cascode amplifiers.

Figure 5:
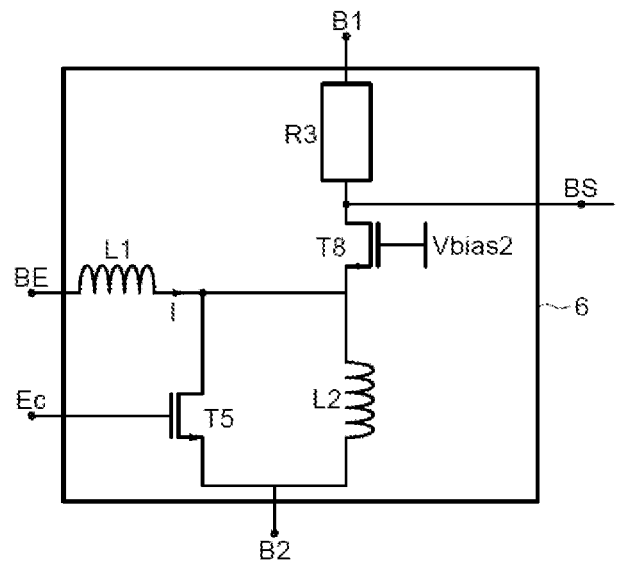

Reference is now made to FIG. 5 which shows an example of another embodiment of an amplifier device 6.

In this embodiment, the amplifier device 6 is produced according to a common gate configuration.

The elements identical to those described in the preceding embodiment are identified by the same numerical references. In this figure, the inductive elements L1 and L2, and the discharge transistor T5 are again present.

The amplifier device 6 comprises an amplifier comprising an amplification transistor T8 supplied at its gate with a dc voltage Vbias2.

According to one embodiment, the transistor T8 is an NMOS transistor.

The source of the amplification transistor T8 is connected to the input BE of the amplifier device 6 by the intermediary of the inductive element L1, and to the power supply terminal B2 by the intermediary of the inductive element L2.

The drain of the amplification transistor T8 is connected to the output BS of the amplifier device 6. The resistive element R3 is connected, at one end, to the power supply terminal B1 and, at the other end, to the output BS.

The drain of the discharge transistor T5 is connected to the common node between the inductive element L1 and the source of the amplification transistor T8. The source of the discharge transistor T5 is connected to the power supply terminal B2.

The value of the bias voltage Vcc of the transistor T8 at the power supply terminal B1 and the value of the resistive element R3 are chosen such that the transistor T8 amplifies the signal received from the input BE according to a predefined operating point of the transistor T8.

The value of the voltage Vbias2 is chosen in such a way as to optimize the input impedance, gain, noise figure and linearity properties of the amplification transistor T8.

The transmit/receive functioning of this amplifier device 6 is identical to that descried in the first embodiment.

Figure 6:
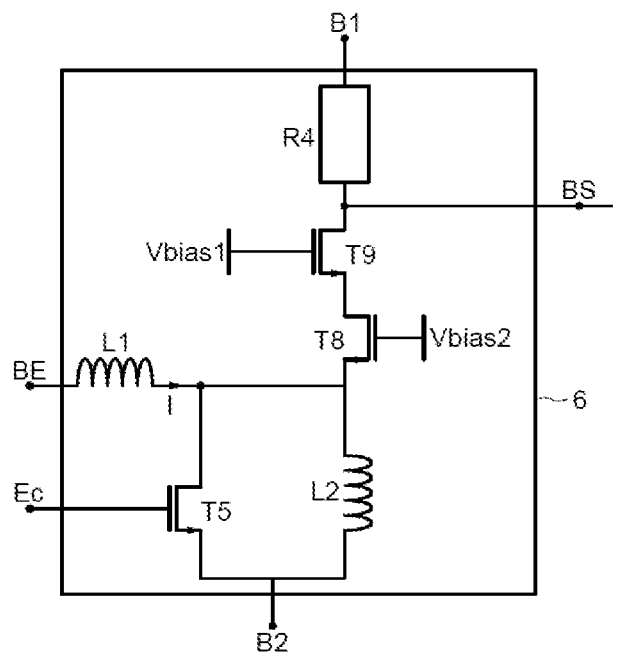

Reference is now made to FIG. 6 which shows an example of another embodiment of an amplifier device 6.

In this embodiment, the amplifier device 6 is produced according to a cascode common gate configuration.

The elements identical to those described in the preceding embodiment are identified by the same numerical references. In this figure the inductive elements L1 and L2, the discharge transistor T5 and the amplification transistor T8 supplied at its gate by the de voltage Vbias2 are again present. These elements are arranged as described above.

The amplifier device 6 comprises moreover a transistor T9 supplied at its gate by a de voltage Vbias1 and a resistive element R4.

According to one embodiment, the transistor T9 is an NMOS transistor.

The drain of the amplification transistor T8 is connected to the source of the transistor T9. The drain of the transistor T9 is connected, at one end, to the output BS of the amplifier device 6 and, at the other end, to a first terminal of the resistive element R4. The second terminal of the resistive element R4 is connected to the power supply terminal B1.

The value of the voltage Vbias1 is chosen to be higher than the threshold voltage of the transistor T9. The transistor T9 is on.

As described above, the value of the voltage Vbias2 is chosen in such a way as to optimize the input impedance, gain, noise figure and linearity properties of the amplification transistor T8.

The value of the bias voltage Vcc of the transistor T8 at the power supply terminal B1 and the value of the resistive element R4 are chosen such that the transistor T8 amplifies the signal received from the input BE according to a predefined operating point of the transistor T8.

The transmit/receive functioning of this amplifier device 6 is identical to that described in the first embodiment.

Figure 7:
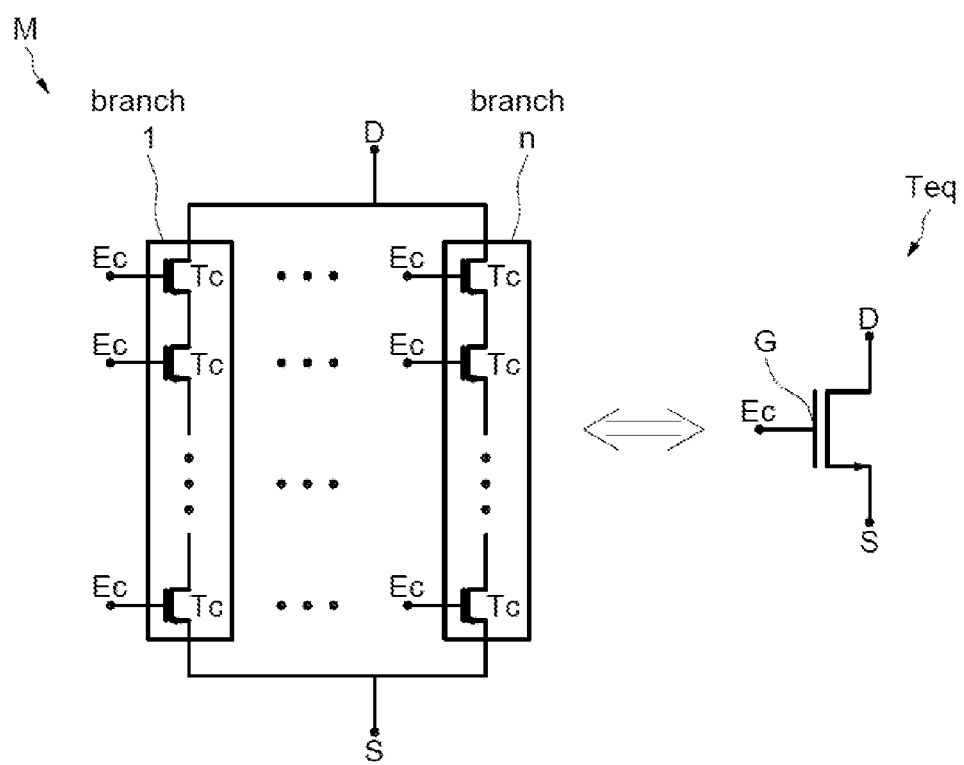

Moreover, according to one embodiment, the discharge transistor T5 can be produced in the form of a matrix of transistors as shown in FIG. 7.

The switching transistors T1, T2 and T3 are generally produced in the form of matrices of transistors.

According to one embodiment, the matrix M of NMOS field effect transistors is equivalent to an NMOS transistor Teq comprising a drain electrode D, a gate electrode G and a source electrode S.

The matrix of transistors comprises n branches (denoted branch 1, . . . branch n) connected to each other in parallel. Each branch comprises NMOS transistors Tc connected in series, the drain of one of them being connected to the source of the next one. The free connections of the transistors at the ends of the branches are connected to the common nodes D and S. The gates of the transistors Tc are controlled by the same signal Ec.

All of the branches comprise the same number of transistors Tc. The number of transistors Tc is determined such that the equivalent transistor Teq is sized in order to withstand a predetermined voltage. The n branches make it possible to improve the coefficient Coeff*Ron.

Advantageously, for equal performance, the matrix of transistors has small overall dimensions because the transistors comprised in the matrix are of small size.

Advantageously, the cascode amplifiers have improved gain, noise, consumption and isolation properties in comparison with other amplifiers.

What is claimed is:

1. A communication apparatus comprising:
   an antenna; and
   a receive chain comprising an amplifier device and a controllable switching circuit coupled between an input of the amplifier device and the antenna;
   wherein the controllable switching circuit has an intrinsic capacitance;
   wherein the controllable switching circuit has an off state and an on state;
   wherein the amplifier device comprises an inductive element and a discharge circuit, the inductive element coupled between the controllable switching circuit and the discharge circuit; and
   wherein the discharge circuit of the amplifier device is coupled to the controllable switching circuit to discharge the intrinsic capacitance of the controllable switching circuit in the off state.

2. The communication apparatus according to claim 1, wherein the amplifier device further comprises an amplification transistor that is coupled to the input of the amplifier device by the inductive element, wherein the discharge circuit is connected between the inductive element and the amplification transistor.

3. The communication apparatus according to claim 1, wherein the discharge circuit comprises a controllable discharge transistor.

4. The communication apparatus according to claim 3, wherein the discharge circuit comprises a matrix of transistors.

5. The communication apparatus according to claim 1, wherein the discharge circuit comprises a matrix of discharge transistors controllable by a common control signal.

6. The communication apparatus according to claim 1, wherein the amplifier device comprises an amplification transistor.

7. The communication apparatus according to claim 6, wherein the amplifier device further comprises a ground terminal, a control electrode of the amplification transistor being connected to the input of the amplifier device and the discharge circuit being connected between the control electrode of the amplification transistor and the ground terminal.

8. The communication apparatus according to claim 6, wherein the amplifier device further comprises a ground terminal, the discharge circuit being connected between a source of the amplification transistor and the ground terminal.

9. The communication apparatus according to claim 1, further comprising a transmit chain that comprises a power amplifier coupled to the antenna by a second controllable switching circuit having an off state and an on state.

10. A communication apparatus comprising a receive chain, the receive chain comprising:
    an antenna node;
    an impedance-matching inductive element;
    a switching transistor having a current path coupled between the antenna node and a first terminal of the impedance-matching inductive element;
    a discharge transistor coupled between a second terminal of the impedance-matching inductive element and a ground terminal;
    an amplification transistor coupled to the second terminal of the impedance-matching inductive element, the amplification transistor having a current path between a first transistor terminal and a second transistor terminal;
    a resistive element coupled between the first transistor terminal of the amplification transistor and a reference supply terminal; and
    a degeneration inductive element coupled between the second transistor terminal of the amplification transistor and the ground terminal.

11. The communication apparatus of claim 10, wherein the amplification transistor has a control terminal coupled to the second terminal of the impedance-matching inductive element.

12. The communication apparatus of claim 11, further comprising a further transistor having a current path coupled between the second transistor terminal of the amplification transistor and the resistive element, the further transistor also having a control terminal coupled to a bias voltage node.

13. The communication apparatus of claim 10, wherein the amplification transistor has a control terminal coupled to a bias voltage node.

14. The communication apparatus of claim 13, further comprising a further transistor having a current path coupled between the second transistor terminal of the amplification transistor and the resistive element, the further transistor also having a control terminal coupled to a second bias voltage node.

15. The communication apparatus of claim 10, wherein the discharge transistor comprises a plurality of transistors coupled between a second terminal of the impedance-matching inductive element and a ground terminal.

16. The communication apparatus of claim 15, wherein the plurality of transistors comprises a matrix of transistors.

17. The communication apparatus of claim 10, further comprising an antenna coupled to the antenna node.

18. The communication apparatus of claim 17, further comprising:
    a baseband circuit with an input coupled to a second terminal of the impedance-matching inductive element, the discharge transistor having a control terminal coupled to an output of the baseband circuit; and
    a transmit chain coupled between the antenna and the baseband circuit.

19. The communication apparatus of claim 10, wherein the switching transistor has an off state and an on state and wherein the discharge transistor is configured to discharge an intrinsic capacitance of the switching transistor in the off state.

20. A receive chain of a communication device, the receive chain comprising:
   a switching transistor;
   an amplification transistor having a control terminal coupled to a current path terminal of the switching transistor; and
   a discharge transistor having a current path coupled between the control terminal of the amplification transistor and a ground terminal, wherein the discharge transistor is configured to discharge an intrinsic capacitance of the switching transistor when the switching transistor is in an off state.

21. The receive chain of claim 20, further comprising
   a resistive element coupled between a first current path terminal of the amplification transistor and a reference supply terminal;
   an impedance-matching inductive element coupled between a second current path terminal of the switching transistor and an antenna node; and
   a degeneration inductive element coupled between a second current path terminal of the amplification transistor and the ground terminal.

22. The receive chain of claim 20, wherein the discharge transistor comprises a matrix of transistors that each have a current path coupled between the control terminal of the amplification transistor and the ground terminal, wherein control terminals of each transistor of the matrix are coupled together.

* * * * *